(12) United States Patent
Zhang et al.

(10) Patent No.: US 11,808,446 B1
(45) Date of Patent: Nov. 7, 2023

(54) MODULAR SYSTEM

(71) Applicant: FOSHAN CARRO ELECTRICAL CO., LTD., Foshan (CN)

(72) Inventors: Jian-Sheng Zhang, Foshan (CN); Zi-Jian Chen, Foshan (CN); Jian Gao, Foshan (CN)

(73) Assignee: Foshan Carro Electrical Co., Ltd., Foshan (CN)

( * ) Notice: Subject to any disclaimer, the term of this patent is extended or adjusted under 35 U.S.C. 154(b) by 0 days.

(21) Appl. No.: 18/166,734

(22) Filed: Feb. 9, 2023

(30) Foreign Application Priority Data

Sep. 15, 2022 (CN) .......................... 202222441977.X (51) Int. Cl.
| | |
|---|---|
| *F21V 33/00* | (2006.01) |
| *H05K 5/02* | (2006.01) |
| *H02K 11/30* | (2016.01) |
| *F21Y 115/10* | (2016.01) |

(52) U.S. Cl.
CPC .......... *F21V 33/0096* (2013.01); *H02K 11/30* (2016.01); *H05K 5/0204* (2013.01); *H05K 5/0247* (2013.01); *F21Y 2115/10* (2016.08)

(58) Field of Classification Search
CPC .. F21V 33/0096; H02K 11/30; H05K 5/0204; H05K 5/0247
See application file for complete search history.

(56) References Cited

U.S. PATENT DOCUMENTS

| | | | | |
|---|---|---|---|---|
| 11,236,753 | B1 * | 2/2022 | Campbell | F04D 29/005 |
| 2022/0381429 | A1 * | 12/2022 | Wang | G03B 21/001 |
| 2023/0047172 | A1 * | 2/2023 | McKinzie | F21V 33/0096 |
| 2023/0077609 | A1 * | 3/2023 | Zhang | F21V 33/0096 |
| | | | | 416/204 R |
| 2023/0124160 | A1 * | 4/2023 | Ding | F04D 29/382 |
| | | | | 416/205 |

* cited by examiner

*Primary Examiner* — Christopher E Dunay
(74) *Attorney, Agent, or Firm* — Rosenberg, Klein & Lee (57) ABSTRACT

The present invention provides a modular system having a first connection structure, a fan unit, and a circuit board unit. The circuit board unit includes a control and communication circuit board respectively electrically connected to a power module circuit board and a driver module circuit board. The driver module circuit board is electrically connected to a fan unit load of the fan unit. The power module circuit board, the control and communication circuit board, and the driver module circuit board are respectively mounted in a first protection shell of the first connection structure or in a fan protection shell of the fan unit. The modular system allows implementations of different circuit board structures for a ceiling fan with or without a pendant light. The modular system allows a control circuit board to more conveniently fit into the ceiling fan with or without the pendant light.

7 Claims, 8 Drawing Sheets

MODULAR SYSTEM

CROSS-REFERENCE TO RELATED APPLICATION(S)

This application claims the priority benefit of CN application serial No. 202222441977.X filed on Sep. 15$^{th}$, 2022, the entirety of which is hereby incorporated by reference herein and made a part of specification.

BACKGROUND OF THE INVENTION

1. Field of the Invention

The present invention relates to a system for a fan, more particularly a modular system for a fan.

2. Description of the Related Art

A conventional ceiling fan attached with a pendant light includes a motor driver module, a light-emitting diode (LED) driver module, and a control module. The motor driver module, the LED driver module, and the control module are packaged and integrated onto a circuit board, thus creating the circuit board with various functioning modules.

However, in order to fit all of the said modules, the circuit board requires large amount of circuit space. This prevents the circuit board from easily fitting into the conventional ceiling fan. Furthermore, the circuit board with various functioning modules takes longer time to manufacture, takes longer time to conduct performance tests, and has low yield. As such, the circuit board with various modules is inefficiently produced.

SUMMARY OF THE INVENTION

To overcome the aforementioned shortcomings, the present invention provides a modular system. The modular system allows a control circuit board to more conveniently fit into a ceiling fan with or without a pendant light, and to be more efficiently produced.

The modular system of the present invention includes a first connection structure, a fan unit, and a circuit board unit.

The first connection structure is adapted to be connected to a hanger or a mount plate on a ceiling, and the first connection structure has a first protection shell. The fan unit is connected to the ceiling through the first connection structure, and the fan unit has a fan unit load and a fan protection shell. The circuit board unit further includes a driver module circuit board, a control and communication circuit board, and a power module circuit board.

The driver module circuit board is electrically connected to the fan unit load of the fan unit, and the driver module circuit board is mounted in the first protection shell or in the fan protection shell. The control and communication circuit board is electrically connected to the driver module circuit board, and the control and communication circuit board is mounted in the first protection shell or in the fan protection shell. The power module circuit board is electrically connected to the control and communication circuit board, and the power module circuit board is mounted in the first protection shell or in the fan protection shell.

More particularly, in an embodiment, the fan unit further includes a fan module and a light module.

The fan module has an upper side and a lower side, the upper side of the fan module is connected to the ceiling through the first connection structure, and the lower side of the fan module is connected to the light module.

In an embodiment, the driver module circuit board further includes a motor driver circuit board and a light-emitting diode (LED) driver circuit board.

The motor driver circuit board is electrically connected to the control and communication circuit board, and the motor driver circuit board is also electrically connected to a fan module load of the fan module. The LED driver circuit board is electrically connected to the control and communication circuit board, and the LED driver circuit board is also electrically connected to a light module load of the light module.

In an embodiment, the motor driver circuit board is mounted in the first protection shell of the first connection structure, in a fan module protection shell of the fan module, or in a light module protection shell of the light module. The LED driver circuit board is mounted in the first protection shell of the first connection structure, in the fan module protection shell of the fan module, or in the light module protection shell of the light module.

In an embodiment, the power module circuit board is mounted in the first protection shell of the first connection structure, in a fan module protection shell of the fan module, or in a light module protection shell of the light module. The control and communication circuit board is mounted in the first protection shell of the first connection structure, in the fan module protection shell of the fan module, or in the light module protection shell of the light module.

In an embodiment, the control and communication circuit board includes a control signal output port and a signal feedback input port. The driver module circuit board includes a control signal input port and a signal feedback output port. The control signal output port of the control and communication circuit board is electrically connected to the control signal input port of the driver module circuit board. The signal feedback output port of the driver module circuit board is electrically connected to the signal feedback input port of the control and communication circuit board.

In an embodiment, the power module circuit board includes a power output port. The control and communication circuit board includes a control output port and a control input port. The driver module circuit board includes a driver output port and a driver input port. The power output port of the power module circuit board, the control output port and the control input port of the control and communication circuit board, and the driver output port and the driver input port of the driver module circuit board are all respectively electrically connected to corresponding conducting wires through pin header connectors or female header connectors.

The present invention has the following effect:

The power module circuit board is electrically connected to a power source for receiving power. The power module circuit board then distributes the power to the control and communication circuit board. The control and communication circuit board receives the power, and receives an external signal from an external device. The control and communication circuit board generates a driver signal according to the external signal by controlling the driver module circuit board. The driver module circuit board drives the fan unit load of the fan unit with the driver signal.

Since the circuit board unit, as a control circuit board, is separated into independently working parts, each of the driver module circuit board, the control and communication circuit board, and the power module circuit board takes up relatively less circuit space for controlling the fan unit. As such, the driver module circuit board, the control and communication circuit board, and the power module circuit board can be more freely mounted relative to the first connection structure and the fan unit, for instance, to be mounted in the first protection shell or in the fan protection shell.

Furthermore, as the circuit board unit is separated into smaller circuit board parts, each of the driver module circuit board, the control and communication circuit board, and the power module circuit board can be tested independently. If any one of the driver module circuit board, the control and communication circuit board, and the power module circuit board fails a test, the faulty circuit board can be changed without affecting other circuit boards, and the control circuit board as a whole avoids needing to be reproduced entirely. As such, the modular system of the present invention allows the control circuit board to be more efficiently produced.

DETAILED DESCRIPTION OF THE INVENTION

With reference to FIGS. 1 to 8, the present invention provides a modular system. The modular system includes a first connection structure 1, a fan unit 2, and a circuit board unit.

Figure 1:
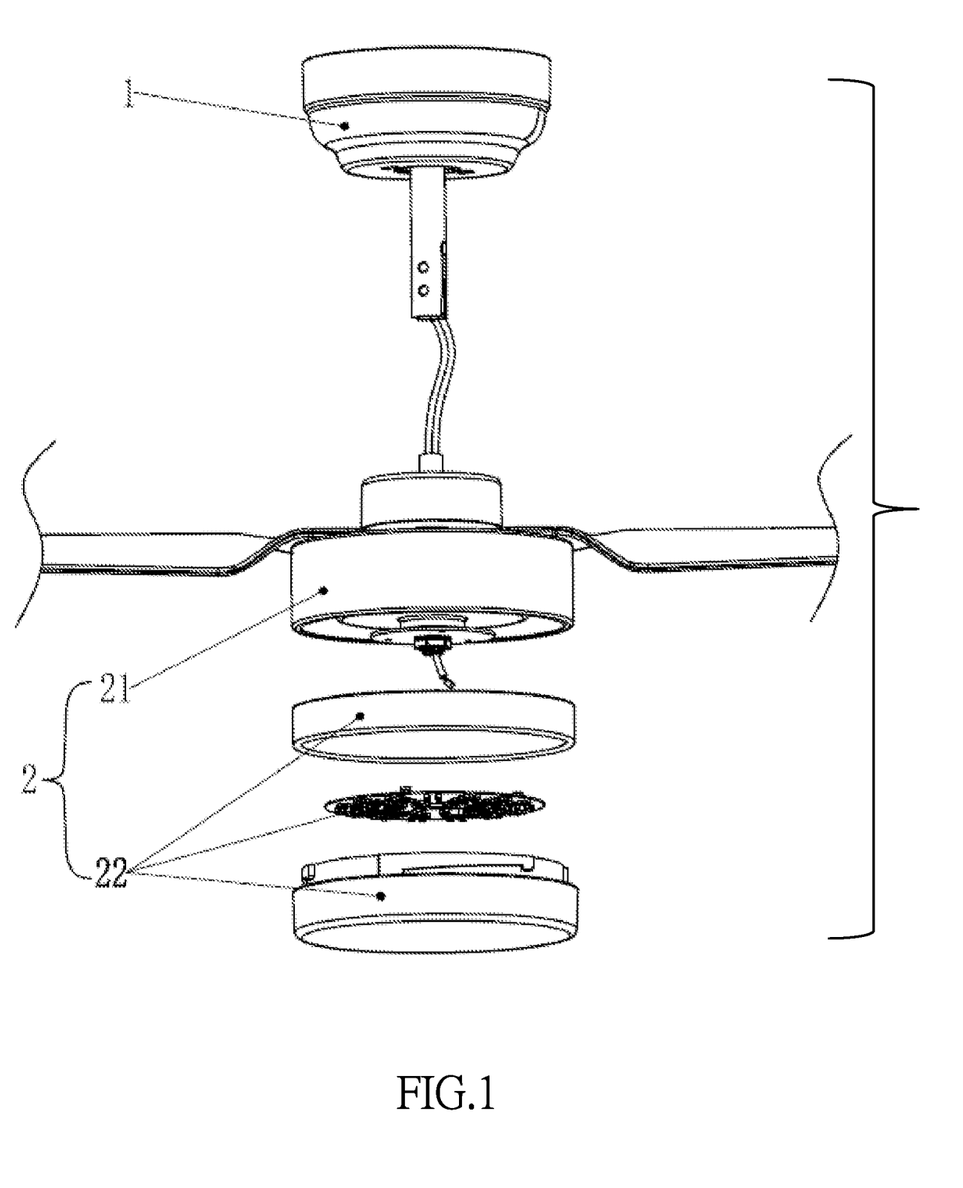
FIG. 1 is a structural perspective view of an embodiment of a modular system of the present invention.
Figure 3:
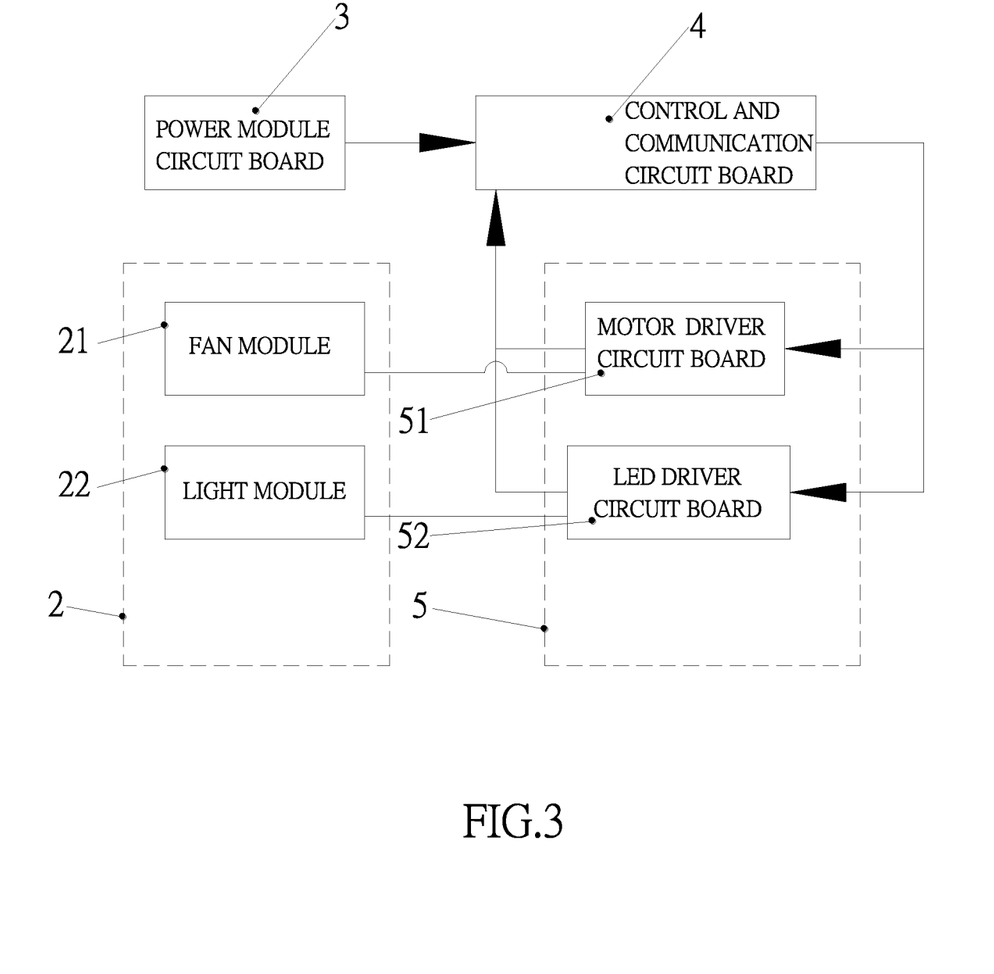
FIG. 3 is a block diagram of an embodiment of the modular system of the present invention.

The first connection structure 1 is adapted to be connected to a hanger or a mount plate on a ceiling, and the first connection structure 1 has a first protection shell. The fan unit 2 is connected to the ceiling through the first connection structure 1, and the fan unit 2 has a fan unit load and a fan protection shell.

The circuit board unit further includes a power module circuit board 3, a control and communication circuit board 4, and a driver module circuit board 5. The power module circuit board 3 is electrically connected to the control and communication circuit board 4, and the control and communication circuit board is further electrically connected to the driver module circuit board 5. The driver module circuit board 5 is further electrically connected to the fan unit load of the fan unit 2.

The power module circuit board 3 is mounted in the first protection shell of the first connection structure 1 or in the fan protection shell of the fan unit 2. The control and communication circuit board 4 is mounted in the first protection shell of the first connection structure 1 or in the fan protection shell of the fan unit 2. The driver module circuit board 5 is also mounted in the first protection shell of the first connection structure 1 or in the fan protection shell of the fan unit 2.

In an embodiment of the present invention, the fan unit 2 includes a fan module 21. In another embodiment of the present invention, the fan unit 2 includes a light module 22. In yet another embodiment of the present invention, the fan unit 2 includes both the fan module 21 and the light module 22.

The first connection structure 1 has a hanger main body and the first protection shell. The first protection shell of the first connection structure 1 covers the hanger main body for protecting the hanger main body. The fan unit 2 is connected to the hanger main body and thus the fan unit 2 is connected to the ceiling through the hanger main body. Furthermore, the fan protection shell of the fan unit 2 covers an external portion of the fan unit load for protecting the fan unit load.

The power module circuit board 3 is electrically connected to a power source for receiving power. The power module circuit board 3 then distributes the power to the control and communication circuit board 4. The control and communication circuit board 4 receives the power and also receives an external signal from an external device. The control and communication circuit board 4 generates a driver signal according to the external signal by controlling the driver module circuit board 5. The driver module circuit board 5 drives the fan unit load of the fan unit 2 with the driver signal.

Since the circuit board unit, as a control circuit board, is separated into independently working parts, each of the power module circuit board 3, the control and communication circuit board 4, and the driver module circuit board 5 takes up relatively less circuit space for controlling the fan unit 2. As such, the power module circuit board 3, the control and communication circuit board 4, and the driver module circuit board 5 can be more freely mounted relative to the first connection structure 1 and the fan unit 2, for instance, to be mounted in the first protection shell of the first connection structure 1 or in the fan protection shell of the fan unit 2.

Furthermore, as the circuit board unit is separated into smaller circuit board parts, each of the power module circuit board 3, the control and communication circuit board 4, and the driver module circuit board 5 can be tested independently. If any one of the power module circuit board 3, the control and communication circuit board 4, and the driver module circuit board 5 fails a test, the faulty circuit board can be changed without affecting other circuit boards, and the control circuit board as a whole avoids needing to be reproduced entirely. As such, the modular system of the present invention allows the control circuit board to be more efficiently produced.

In an embodiment, the fan unit 2 includes both the fan module 21 and the light module 22.

The fan module 21 has an upper side and a lower side, wherein the upper side of the fan module 21 is connected to the ceiling through the first connection structure 1, and the lower side of the fan module 21 is connected to the light module 22. The fan module 21 produces wind by rotating fans. The light module 22, as connected to the lower side of the fan module 21, emits light for lighting up an environment below the fan module 21.

In an embodiment of the present invention, the driver module circuit board 5 further includes a motor driver circuit board 51 and a light-emitting diode (LED) driver circuit board 52. The fan module 21 has a fan module load, and the light module 22 has a light module load.

The control and communication circuit board 4 is respectively connected to the motor driver circuit board 51 and the LED driver circuit board 52. The motor driver circuit board 51 is further electrically connected to the fan module load of the fan module 21. The LED driver circuit board 52 is further electrically connected to the light module load of the light module 22.

In the present invention, the fan module load of the fan module 21 is a motor driving the fans to rotate for the fan module 21, and the light module load of the light module 22 is an LED light panel providing light for the light module 22. The fan unit load of the fan unit 2 includes the fan module load of the fan module and the light module load of the light module 22. After the control and communication circuit board 4 receives power from the power module circuit board 3, the control and communication circuit board 4 generates the driver signal according to the external signal by controlling the motor driver circuit board 51 and/or by controlling the LED driver circuit board 52. The motor driver circuit board 51 subsequently controls the fan module load of the fan module 21 with the corresponding driver signal, and the LED driver circuit board 52 subsequently controls the light module load of the light module 22 with the corresponding driver signal.

In an embodiment, the fan module 21 has a fan module protection shell, and the light module 22 has a light module protection shell. The motor driver circuit board 51 is mounted in the first protection shell of the first connection structure 1, in the fan module protection shell of the fan module 21, or in the light module protection shell of the light module 22. The LED driver circuit board is also mounted in the first protection shell of the first connection structure 1, in the fan module protection shell of the fan module 21, or in the light module protection shell of the light module 22.

More particularly, the power module circuit board 3 is mounted in the first protection shell of the first connection structure 1, in the fan module protection shell of the fan module 21, or in the light module protection shell of the light module 22. The control and communication circuit board 4 is mounted in the first protection shell of the first connection structure 1, in the fan module protection shell of the fan module 21, or in the light module protection shell of the light module 22.

Moreover, in a first embodiment, the power module circuit board 3 and the control and communication circuit board 4 are both simultaneously mounted in the first protection shell of the first connection structure 1. The motor driver circuit board 51 is mounted in the fan module protection shell of the fan module 21. The LED driver circuit board 52 is mounted in the light module protection shell of the light module 22.

In a second embodiment, the power module circuit board 3 is mounted in the first protection shell of the first connection structure 1. The control and communication circuit board 4 and the motor driver circuit board 51 are both simultaneously mounted in the fan module protection shell of the fan module 21. The LED driver circuit board 52 is mounted in the light module protection shell of the light module 22.

In a third embodiment, the power module circuit board 3 and the LED driver circuit board 52 are simultaneously mounted in the first protection shell of the first connection structure 1. The motor driver circuit board 51 is mounted in the fan module protection shell of the fan module 21. The control and communication circuit board 4 is mounted in the light module protection shell of the light module 22. Since the light module protection shell of the light module 22 is located closer to an external control device (such as a controller), the control and communication circuit board 4 within the light module protection shell is able to better receive communication signals transmitted from the external control device. As such, the control and communication circuit board 4 is able to efficiently and reliably receive the communication signals.

In a fourth embodiment, the power module circuit board 3, the control and communication circuit board 4, the motor driver circuit board 51, and the LED driver circuit board 52 are all simultaneously mounted in the fan module 21.

Figure 4:
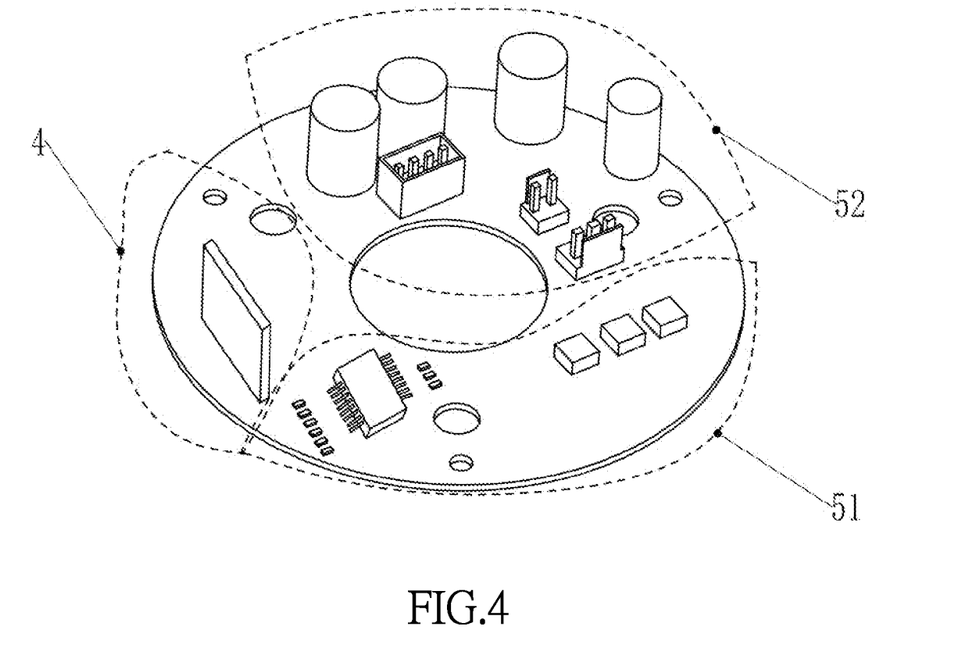
FIG. 4 is a circuit perspective view of an embodiment of the modular system of the present invention.

With reference to FIG. 4, in an embodiment, the control and communication circuit board 4, the motor driver circuit board 51, and the LED driver circuit board 52 are mounted together on a disk-shaped circuit board, and the power module circuit board 3 is mounted elsewhere separately.

Figure 5:
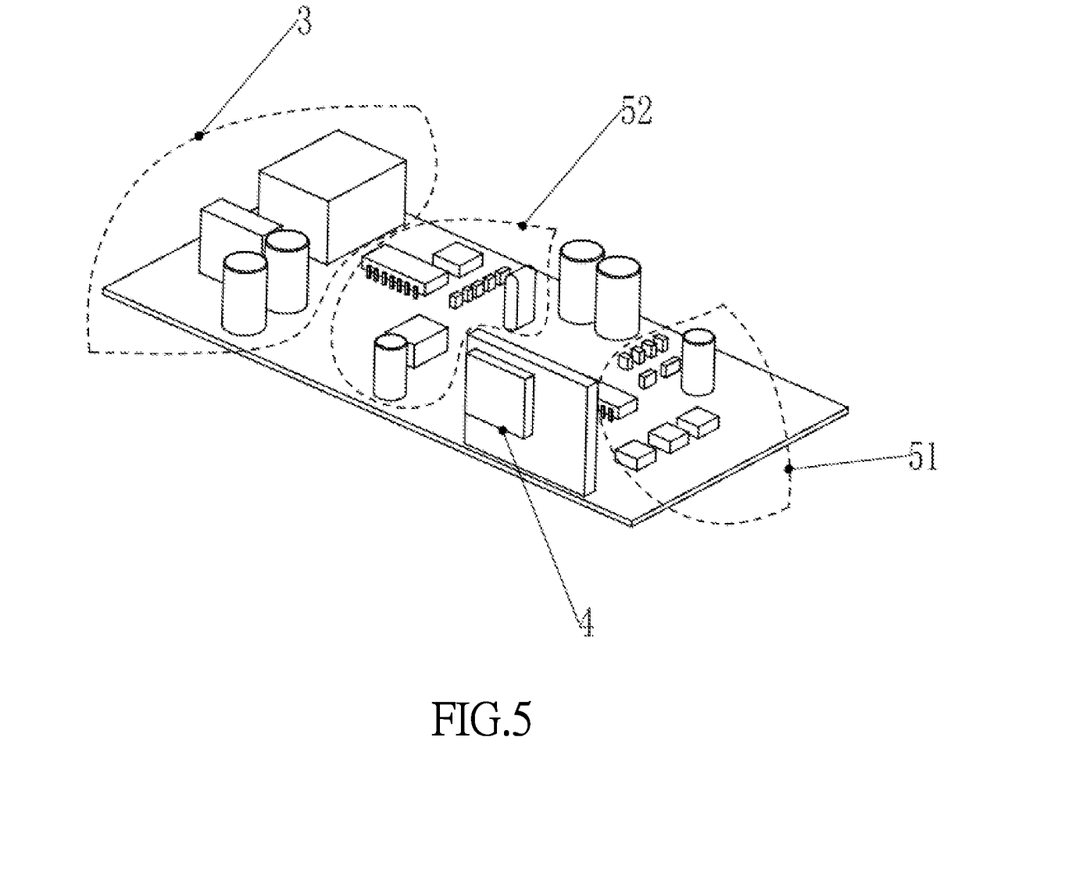
FIG. 5 is another circuit perspective view of an embodiment of the modular system of the present invention.

With reference to FIG. 5, in another embodiment, the power module circuit board 3, the control and communication circuit board 4, the motor driver circuit board 51, and the LED driver circuit board 52 are mounted together on a rectangular circuit board.

Figure 6:
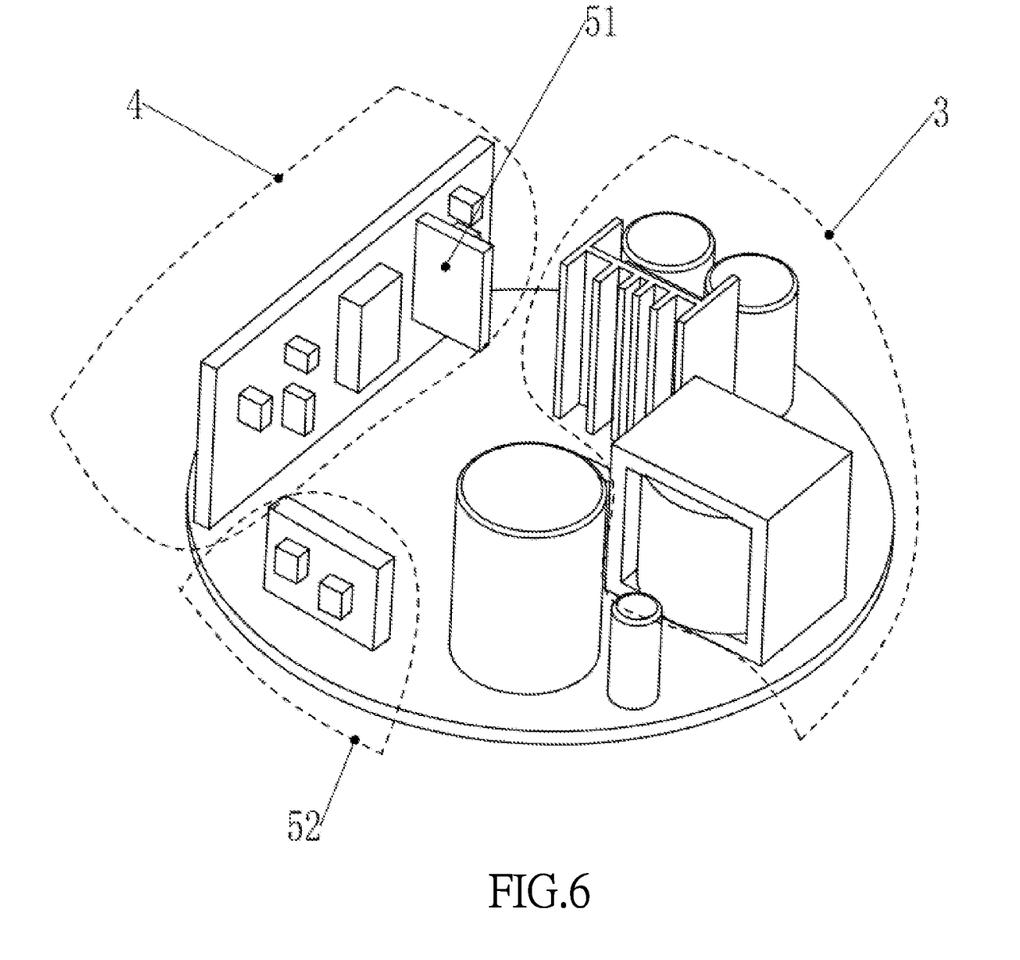
FIG. 6 is another circuit perspective view of an embodiment of the modular system of the present invention.

With reference to FIG. 6, in another embodiment, the power module circuit board 3, the control and communication circuit board 4, the motor driver circuit board 51, and the LED driver circuit board 52 are mounted together on a circular circuit board.

The disk-shaped circuit board, the rectangular circuit board, and the circular circuit board mentioned in FIGS. 4 to 6 are free to be mounted in the first protection shell of the first connection structure 1, in the fan module protection shell of the fan module 21, or in the light module protection shell of the light module 22. As such, the present invention demonstrates the versatility of the modular system to accommodate circuit boards in different modular forms and shapes.

In an embodiment, the control and communication circuit board 4 includes a control signal output port and a signal feedback input port. The driver module circuit board 5 includes a control signal input port and a signal feedback output port.

The control signal output port of the control and communication circuit board 4 is electrically connected to the control signal input port of the driver module circuit board 5. The signal feedback output port of the driver module circuit board 5 is electrically connected to the signal feedback input port of the control and communication circuit board 4. The driver module circuit board 5 outputs real-time current feedback signal to the control and communication circuit board 4, and the control and communication circuit board 4 controls the driver module circuit board 5 according to the real-time current feedback signal received, stabilizing signals generated by the driver module circuit board 5.

Figure 2:
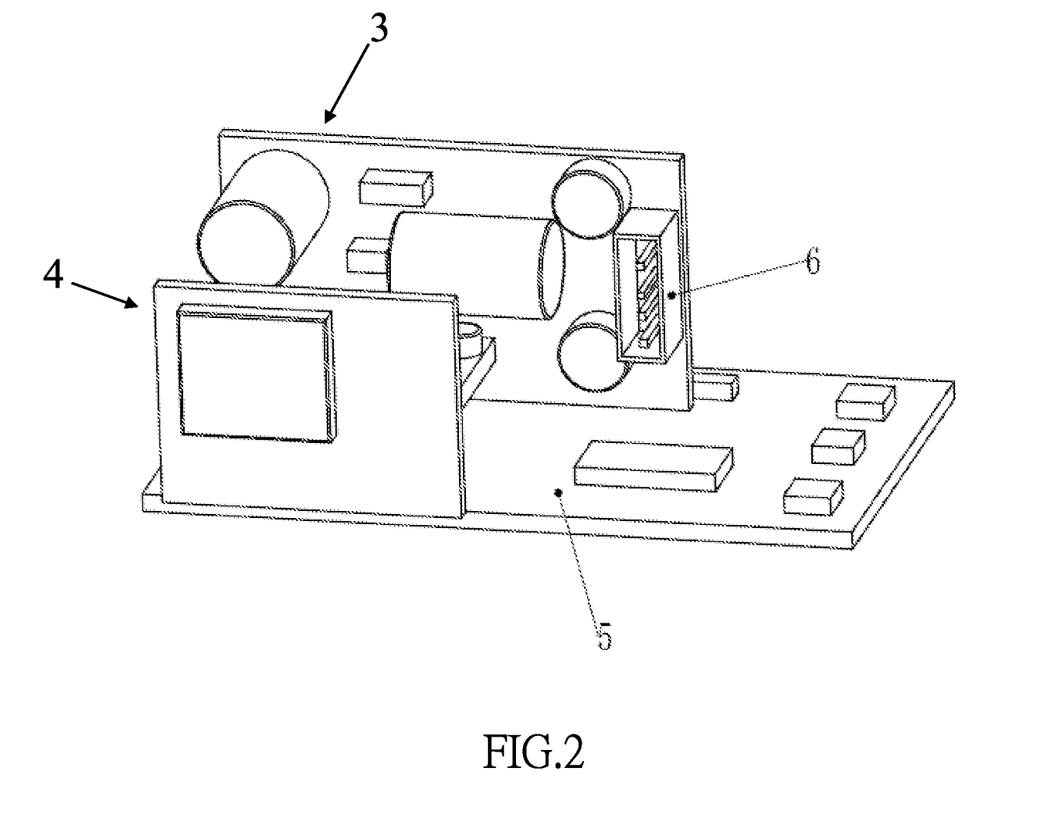
FIG. 2 is a structural perspective view of a driver module circuit board in an embodiment of the modular system of the present invention.

With reference to FIG. 2, in an embodiment, the power module circuit board 3 includes a power output port. The control and communication circuit board 4 includes a control output port and a control input port. The driver module circuit board 5 includes a driver output port and a driver input port.

The power output port of the power module circuit board 3, the control output port and the control input port of the control and communication circuit board 4, and the driver output port and the driver input port of the driver module circuit board 5 are all respectively electrically connected to conducting wires through pin header connectors 6 or female header connectors.

Figure 7:
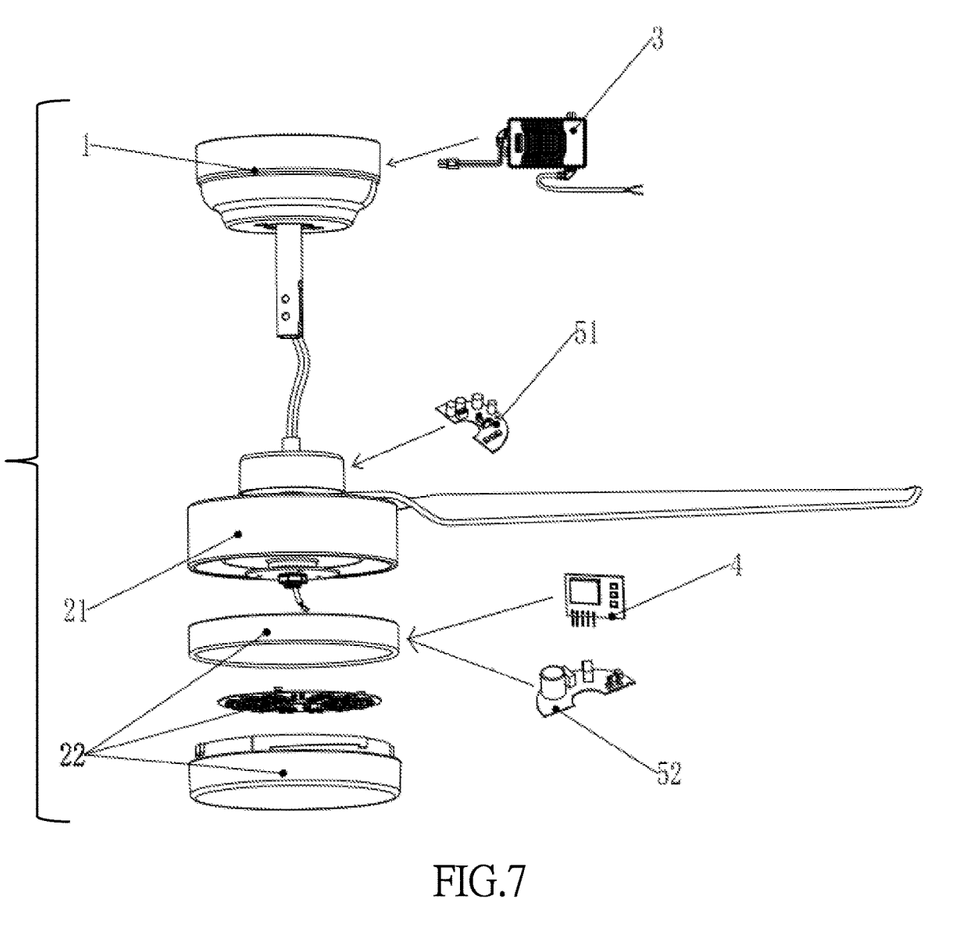
FIG. 7 is a circuit layout of an embodiment of the modular system of the present invention.

With reference to FIG. 7, in a fifth embodiment, the power module circuit board 3 is mounted in the first protection shell of the first connection structure 1. The motor driver circuit board 51 is mounted in the fan module protection shell of the fan module 21. The control and communication circuit board 4 and the LED driver circuit board 52 are simultaneously mounted in the light module protection shell of the light module 22. Moreover, the motor driver circuit board 51 and the LED driver circuit board 52 are respectively half-disk shaped circuit boards.

Figure 8:
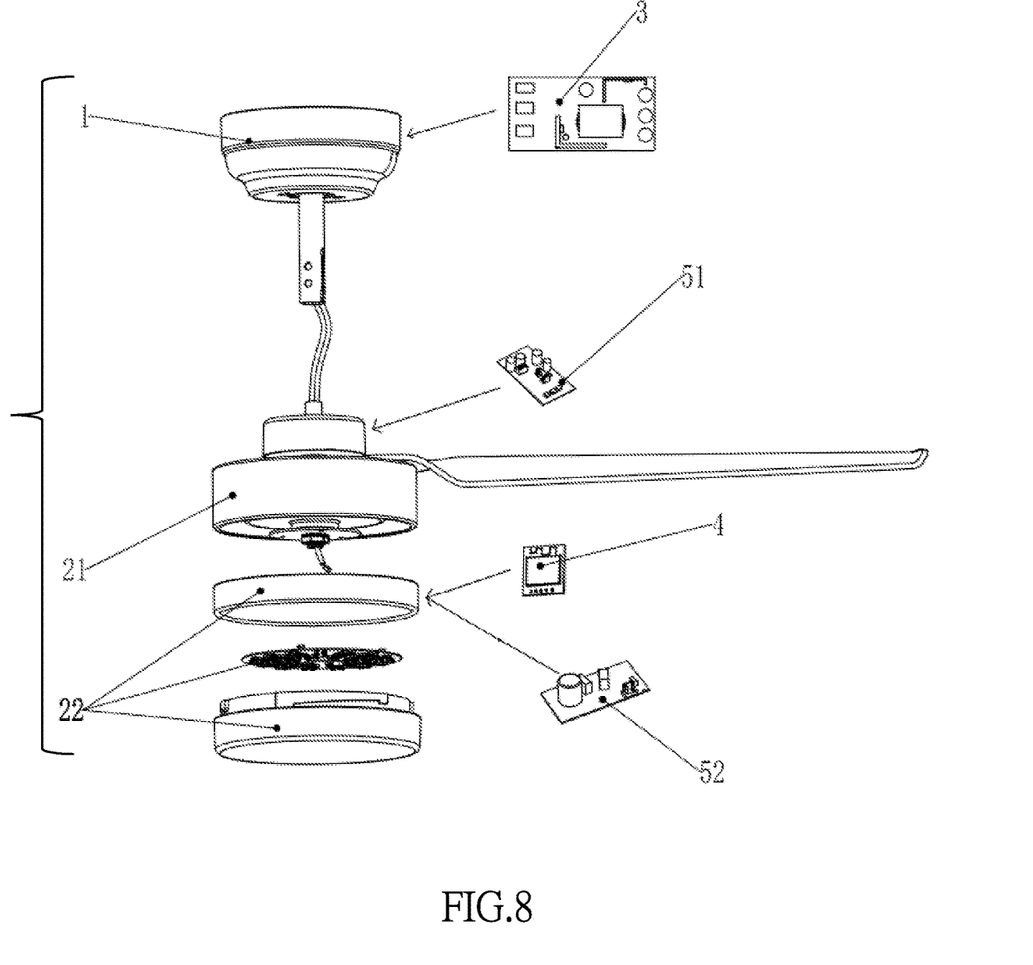
FIG. 8 is a circuit layout of another embodiment of the modular system of the present invention.

With reference to FIG. 8, in a sixth embodiment, the power module circuit board 3, the control and communication circuit board 4, the motor driver circuit board 51, and the LED driver circuit board 52 are all respectively mounted in same locations as in the case of the fifth embodiment. However, in this embodiment, the motor driver circuit board 51 and the LED driver circuit board 52 are respectively rectangular circuit boards. The designs and shape of the power module circuit board 3 and the control and communication circuit board 4 are also visibly different. As such, the present invention demonstrates the versatility of the modular system to fit and implement circuit boards in different modular forms and shapes.

All other components presented in the aforementioned embodiments of the present invention are already known to ordinary personnel of the related field, and are therefore omitted for further explanations.

What is claimed is:

1. A modular system, comprising:
    a first connection structure, adapted to be connected to a hanger or a mount plate on a ceiling, and having a first protection shell;
    a fan unit, connected to the ceiling through the first connection structure, and having a fan unit load and a fan protection shell;
    a circuit board unit, further comprising:
        a driver module circuit board, electrically connected to the fan unit load of the fan unit, and mounted in the first protection shell or in the fan protection shell;
        a control and communication circuit board, electrically connected to the driver module circuit board, and mounted in the first protection shell or in the fan protection shell; and
        a power module circuit board, electrically connected to the control and communication circuit board, and mounted in the first protection shell or in the fan protection shell,
    wherein the driver module circuit board, the control and communication circuit board, and the power module circuit board are each configured to be mountable in the first protection shell and the fan protection shell.

2. The modular system as claimed in claim 1,
    wherein the fan unit further comprises:
        a fan module, having an upper side and a lower side; wherein the upper side is connected to the ceiling through the first connection structure;
        a light module, connected to the lower side of the fan module.

3. The modular system as claimed in claim 2, wherein the driver module circuit board further comprises:
    a motor driver circuit board, electrically connected to the control and communication circuit board, and electrically connected to a fan module load of the fan module;
    a light-emitting diode (LED) driver circuit board, electrically connected to the control and communication circuit board, and electrically connected to a light module load of the light module.

4. The modular system as claimed in claim 3, wherein the motor driver circuit board is mounted in the first protection shell of the first connection structure, in a fan module protection shell of the fan module, or in a light module protection shell of the light module; and
    wherein the LED driver circuit board is mounted in the first protection shell of the first connection structure, in the fan module protection shell of the fan module, or in the light module protection shell of the light module, and
    wherein the motor driver circuit board and the LED driver circuit board are each configured to be mountable in the first protection shell of the first connection structure, in the fan module protection shell of the fan module, and in the light module protection shell of the light module.

5. The modular system as claimed in claim 2, wherein the power module circuit board is mounted in the first protection shell of the first connection structure, in a fan module protection shell of the fan module, or in a light module protection shell of the light module;
    wherein the control and communication circuit board is mounted in the first protection shell of the first connection structure, in the fan module protection shell of the fan module, or in the light module protection shell of the light module, and
    wherein the power module circuit board and the control and communication circuit board are each configured to be mountable in the first protection shell of the first connection structure, in the fan module protection shell of the fan module, and in the light module protection shell of the light module.

6. The modular system as claimed in claim 1, wherein the control and communication circuit board comprises a control signal output port and a signal feedback input port;
    wherein the driver module circuit board comprises a control signal input port and a signal feedback output port;
    wherein the control signal output port of the control and communication circuit board is electrically connected to the control signal input port of the driver module circuit board; and the signal feedback output port of the driver module circuit board is electrically connected to the signal feedback input port of the control and communication circuit board.

7. The modular system as claimed in claim 1, wherein the power module circuit board comprises a power output port;
    wherein the control and communication circuit board comprises a control output port and a control input port;
    wherein the driver module circuit board comprises a driver output port and a driver input port;
    wherein the power output port of the power module circuit board, the control output port and the control input port of the control and communication circuit board, and the driver output port and the driver input port of the driver module circuit board are all respectively electrically connected to conducting wires through pin header connectors or female header connectors.

* * * * *